United States Patent [19]

Toda

[11] Patent Number: 5,592,436
[45] Date of Patent: Jan. 7, 1997

[54] DATA TRANSFER SYSTEM

[75] Inventor: Haruki Toda, Yokohama, Japan

[73] Assignee: Kabushiki Kaisha Toshiba, Kawasaki, Japan

[21] Appl. No.: 397,038

[22] Filed: Feb. 27, 1995

Related U.S. Application Data

[60] Continuation-in-part of Ser. No. 345,682, Nov. 21, 1994, Pat. No. 5,508,970, which is a division of Ser. No. 111,046, Aug. 24, 1993, Pat. No. 5,392,254.

[30] Foreign Application Priority Data

Aug. 28, 1992 [JP] Japan .................... 4-230583

[51] Int. Cl.$^6$ .................................... G11C 8/04
[52] U.S. Cl. ................ 365/240; 365/189.12; 365/220; 365/221
[58] Field of Search ...................... 365/240, 219, 365/220, 221, 189.01, 189.02, 189.05, 189.12

[56] References Cited

U.S. PATENT DOCUMENTS

| | | | |
|---|---|---|---|
| 4,644,502 | 2/1987 | Kawashima | 365/219 |
| 4,855,959 | 8/1989 | Kobayashi | 365/239 |
| 5,257,255 | 10/1993 | Miyamoto | 365/240 |
| 5,323,358 | 6/1994 | Toda et al. | 365/240 |

FOREIGN PATENT DOCUMENTS

| | | |
|---|---|---|
| 0154314 | 9/1985 | European Pat. Off. . |
| 0212545 | 3/1987 | European Pat. Off. . |

*Primary Examiner*—Tan T. Nguyen
*Attorney, Agent, or Firm*—Foley & Lardner

[57] ABSTRACT

A data transfer system, comprising: a plurality of data input/output gates arranged by k-unit group by k-unit group in a predetermined sequence; gate selector circuit each arranged for k-unit group of the gates, for selecting the gates in unit of k-unit group; a plurality of data transfer paths for transferring data via the gates selected by the gate selector circuit; a first register group composed of a-units of data registers for transferring data simultaneously to and from the data transfer paths, the a-unit data registers being serial-accessed in a constant sequence; and a scrambler circuit for designating any required data input/output gates and for further selectively connecting the data transfer paths connected to said designated data input/output gates with the data registers so that the data transfer paths connected to the designated input/output gates can be connected to the serial-accessible registers in a predetermined sequence, when the number of the data transfer paths is (L×k) under the following conditions:

if $a \pmod{k} \equiv 0, 1$,  $L = [a/k] + 1$
if other than the above,  $L = [a/k] + 2$ where L denotes a maximum number of the gate selecting means selectable simultaneously.

24 Claims, 7 Drawing Sheets

DATA TRANSFER SYSTEM

This is a continuation-in-part application of U.S. application Ser. No. 08/345,682, filed Nov. 21, 1994, now U.S. Pat. No. 5,508,970 which is a divisional application of U.S. application Ser. No. 08/111,046, filed Aug. 24, 1993 U.S. Pat. No. 5,392,254.

FIELD OF THE INVENTION

The present invention relates to a semiconductor memory device, and more specifically to a semiconductor memory device suitable for a clock-synchronous random access memory which can output data at high speed and at random. Further, the present invention relates to a data transfer system for a memory device provided with high speed characteristics and a certain random access function such as synchronous DRAM.

BACKGROUND OF THE INVENTION

With the recent advance of higher processing speed, a microprocessor is provided with a primary memory device of a large capacity. In accompany with the large capacity primary memory device, there has been proposed a memory device capable of accessing data at high speed at the sacrifice of random characteristics of data access, in order to solve a bottleneck with respect to low processing speed due of the low access speed of the external memory device.

An example of the memory device as described above has been proposed (not yet published) by the same inventors in Japanese Patent Application No. 3-255354, in which an address is acquired within a predetermined number of cycles of a basic clock supplied to the system and further data input and output starts a predetermined cycles after the cycle at which the address is acquired. In addition, Japanese Patent Application No. 4-638135 (not yet published) discloses a memory device provided with internal data registers, which operates as follows: a group of access data are stored in the internal registers temporarily for data access between the outside and the memory cells. The data to be stored in the registers are selected by scrambler circuits; that is, a scrambler control circuit controls the scrambler circuits so that access data can be stored cyclically in the respective registers at predetermined sequence for each cycle of a clock signal. Further, the data are inputted and outputted between the outside and the registers via an input/output buffer. In response to a head address indicative of data access start, a predetermined selection sequence of the scrambler circuits is determined.

The above-mentioned semiconductor memory device will be described in more detail with reference to FIG. 4. In FIG. 4, a column decoder 1 selects one of cell blocks CB1 to CB5 of a memory core 2. Each of the cell blocks CB1 to CB5 includes 4 columns CM1 to CM4. Data stored in the four columns CM1 to CM4 of one of the cell blocks CB1 to CB5 (selected by the column decoder 1) are outputted to data lines DLN simultaneously. The data on the data lines DLN are transferred to read/write data lines RWD via a data buffer 4. The read/write data lines RWD are connected to data registers 51 and 52 via scrambler circuits 61 and 62, respectively. A scrambler control circuit 7 controls the two scrambler circuits 61 and 62 so that the data on the read/write data line RWD can be selectively stored 2 bits by 2 bits in data areas R1, R2, R3 and R4 of the data registers 51 and 52, respectively. The data stored in the data registers 51 and 52 are selected by a data selection section 9 and then outputted through a data output buffer 8 as data output.

The operation of the memory device as shown in FIG. 4 will be described hereinbelow.

One block of the five cell blocks CB1 to CB5 of the memory cell 2 is selected by the column decoder 1. Data of the four columns CM1 to CM4 of the selected block are read simultaneously to the data lines DLN, and then transferred to the read/write data lines RWD via the data buffer 4. The four bit data are selectively stored 2 bits by 2 bits in the data areas R1, R2, R3 and R4 of the data registers 51 and 52, respectively via the scrambler circuits 61 and 62 controlled by the scrambler control circuit 7. For instance, the access sequence of the data areas R1, R2, R3 and R4 of the data registers 51 and 52 is as follows: R1, R2, R3 and R4. The data stored in the data areas R1, R2, R3 and R4 are selected by the data selector section 9, transferred to the data output buffer 8, and then outputted therefrom as the data output.

In the semiconductor memory device as described above, however, there exists a problem in that it is impossible to start data access beginning from any given bit of the columns CM1 to CM4, when data more than 4 bits (the number of data areas) are required to be outputted from the data areas R1, R2, R3 and R4 of the data registers 51 and 52. The reason is as follows: since the columns CM1 to CM4 selected by the column decoder 1 are fixed, when 8-bit data are accessed, it is impossible to constitute 8-bit data by simply combining 2 sets of 4-bit data. In other words, it is impossible to obtain an 8-bit continuous access. For example, if the access sequence as "3"-"4"-"5"-"6"-"7"-"8"-"1"-"2" is required, the access sequence is inevitably determined as "3"-"4"-"1"-"2"-"5"-"6"-"7"-"8" or "3"-"4"-"1"-"2"-"7"-"8"-"5"-"6". Although this problem can be solved by using more larger-scale registers or by scarifying the access speed, this method raises another problem in that the memory characteristics of the synchronous memory device are deteriorated.

SUMMARY OF THE INVENTION

With these problems in mind, therefore, the object of the present invention is to provide a clock-synchronous semiconductor memory device high in access speed, by which data of column bits more than the number of registers can be accessed continuously, in spite of the minimum number of registers, and further the column address from which the access starts can be selected freely.

To achieve the above-mentioned object, the present invention provides a semiconductor memory device, comprising: a memory cell array composed of a plurality of memory cells arranged roughly in a matrix pattern including a plurality of columns; data register means provided with two first and second registers each having a-units of one-bit data register; control means for selecting two sets of a-units of the column from a plurality of the columns for each a-cycles in accordance with inputted and read addresses, and for storing the a-units of data of the selected 2a-units of column in either one of the first and second registers alternately on the basis of a sequence of the read addresses; and data output means for scanning and outputting data of the 2a-units of the one-bit data register in sequence.

The data output means outputs data in synchronism with a clock inputted from the outside. The a-units of the column forms one column group in said memory cell array. The control means comprises a plurality of column select lines each for selecting one column group. The columns are connected to the one-bit data registers, respectively through a data transfer line. The data transfer line includes 2 a-units of data transfer line.

The control means executes such a first control operation, in response to a head column address for data output, that 2 a-units of data on 2a-units of the column are transferred to 2a-units of the data transfer lines, by activating the column select lines for selecting the column address group including a column corresponding to the head column address and further the column select lines for selecting the column group including columns corresponding to the column addresses selected successively in sequence. Further, the control means executes such a second control operation that any given column data are outputted as head data for each a-cycles, by selecting a-units of data from the 2a-units of data onto 2a-units of the data transfer lines, by storing the selected data in a-units of the one-bit data register of the registers, to which data are not stored in the preceding data transfer operation, in output sequence, and by repeating the above-mentioned operation.

In accordance with the read address, the control means selectively turns on two predetermined groups of column gate groups to transfer 2a-unit data to the data line groups. Further, a-unit data (based on the read address) of 2a-unit data are stored in the a-unit registers of the first data register group in sequence of the data read operation under control of the control means. The same operation is applied to the second data register group. The above-mentioned operation is repeated to output the data from the respective columns in read address sequence.

In the semiconductor memory device according to the present invention, column data more than the number of the data registers arranged on the output side can be accessed continuously, irrespective of the number of the data registers directly, and further any access start address can be determined.

DETAILED DESCRIPTION OF THE PREFERRED EMBODIMENTS

The embodiments of the present invention will be described hereinbelow with reference to the attached drawings.

Figure 1:
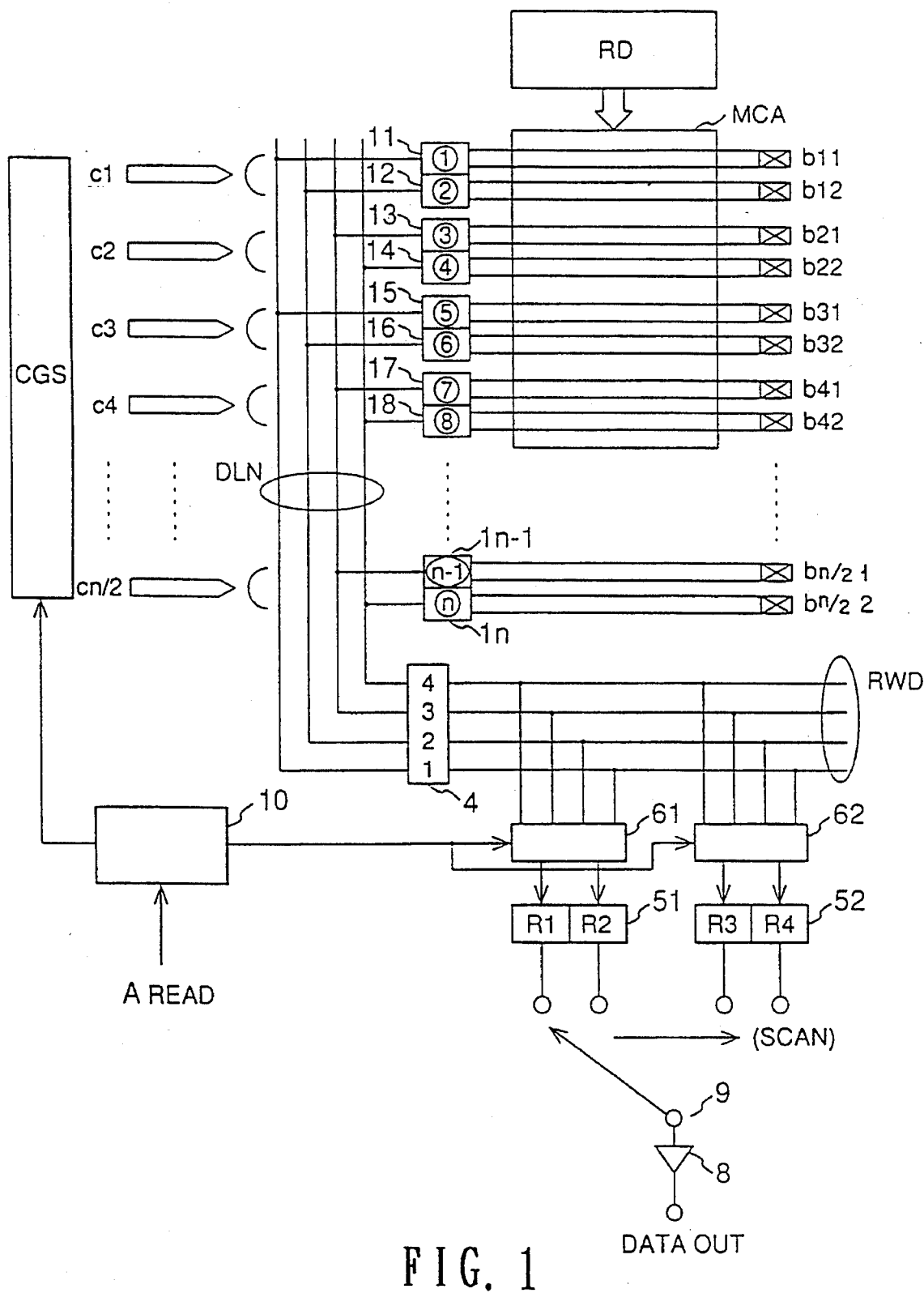
FIG. 1 is block diagram showing one embodiment of the semiconductor memory device according to the present invention.

FIG. 1 is a block diagram showing one embodiment of the semiconductor memory device according to the present invention. In the drawing, a memory cell array MCA includes a plurality of memory cells arranged in matrix pattern. To the memory cell array MCA, decode signals are applied from a row decoder RD. As shown in FIG. 1, columns b11, b12, b21, b22, b31, b32, b41, b42, . . . , b(n/2)1, b(n/2)2 which constitute the memory cell array 1 have a pair of complementary bit lines, respectively. Data on the bit lines can be read by sensing the bit line data by sense amplifiers. The columns b11, b12, b21, b22, b31, b32, b41, b42, . . . , b(n/2)1, b(n/2)2 are connected to column gates 11, 12, 13, 14, 15, 16, 17, 18, . . . , ln-1, ln, respectively. The column gates 11 to in are turned on or off by column select lines C1 to Cn/2, respectively. Two of the column select lines are selected by a column gate group selection circuit CGS. Two column gates are turned on by the single selected column select line. Data on the columns b11, b12, . . . , b(n/2)1, b(n/2)2 are transmitted to data lines DLN through the column gates 11 to ln. A scrambler control circuit 10 controls scrambler circuits 61 and 62, and further selects two column select lines C1 to Cn/2 through the column gate group selection circuit CGS. To the scrambler control circuit 10, a read address $A_{READ}$ is applied.

The operation of the memory device thus constructed will be explained hereinbelow.

When the column select line C1 is activated, two data on the columns b11 and b12 are outputted to the data lines DLN through the column gates 11 and 12. In the same way, when the column select line C2 is activated, two data on the columns b21 and b22 are outputted to the data lines DLN through the column gates 13 and 14. In the same way, when the column select line Cn/2 is activated, two data on the columns b(n/2)1, b(n/2)2 are outputted to the data lines DLN through the column gates ln-1 and ln.

Here, two of the column select lines C1 to Cn/2 are activated simultaneously by the scrambler control circuit 10. As a result, four of the column gates 11 to in can be selected, so that 4-bit data are outputted from the four columns to the data lines DLN. In this case, the column select lines C1 to Cn/2 are selected in such a way that a plurality of the data are not outputted to the same data lines DLN for prevention of data interference. For instance, the column select lines C1 and C3 are not selected simultaneously.

The 4-bit data transferred to the data line DLN are amplified by the data buffer 4, and then transferred to the read/write data lines RWD. Two bits of each of the 4-bit data transferred to the read/write lines RWD as described above are selected by the scrambler circuits 61 and 62, respectively, and then stored in data areas R1 and R2 of a data register 51 or in data areas R3 and R4 of a data register 52, respectively under control of the scrambler control circuit 10 to the scrambler circuits 61 and 62. The data in the areas R1, R2, R3 and R4 of the data registers 51 and 52 are selected by a data selection section 9, and then outputted to the outside through a data output buffer 8 as data output.

Figure 2:
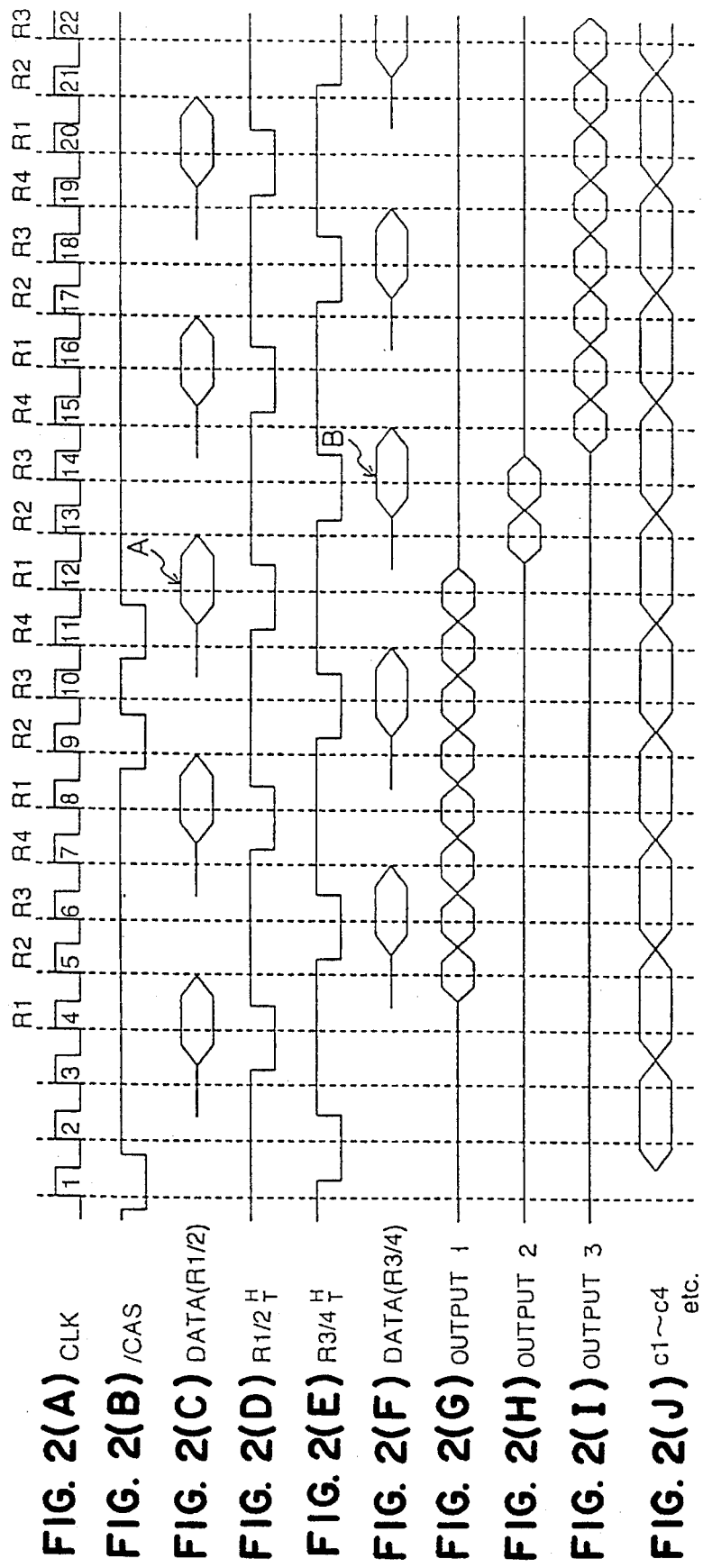
FIG. 2 is a timing chart for assistance in explaining the operation of the memory device shown in FIG. 1.

FIG. 2 is a timing chart which shows the above-mentioned operation in sequence with respect to time. In FIG. 2, (A) indicates a basic clock CLK; (B) indicates a column address select signal /CAS; (C) indicates data including data to be stored in the data areas R1/R2, respectively; (D) indicates a timing at which data are stored in the data areas R1/R2, respectively; (E) indicates a timing at which data are stored in the data areas R3/R4, respectively; (F) indicates data including data to be stored in the data areas R3/R4, respectively; (G), (H) and (I) indicate the statuses of output 1, output 2 and output 3 derived as data output, respectively; and (J) indicates the statuses of the column select lines C1 to Cn/2, respectively.

The selection of the column select lines C1 to Cn/2 are executed newly for each cycle "1", "3", "5", "7", . . . of the clock CLK. The data at the newly selected columns b11 to b(n/2)2 develop on the read/write data lines RWD roughly after two cycles as deterministic data. FIGS. 2(C) and (F) show these deterministic data. Each of these data can be determined being transferred 4 bits by 4 bits. Two bits of the four bits are stored in the data registers 51 and 52, respectively. Therefore, in FIG. 2, data are shown for each data register 51 or 52. Here, FIG. 2 (C) shows 4-bit data including 2-bit data to be stored in the data areas R1 and R2 of the data register 51. Further, FIG. 2 (F) shows 4-bit data including 2-bit data to be stored in the data areas R3 and R4 of the data register 52. When these data have been stored in the data registers 51 and 52 at the time point at which having been determined, it is possible to output these data to the outside by accessing the data stored in the data areas R1, R2, R3 and R4 in sequence with the use of the data selection section 9. FIGS. 2(D) and (E) show the timings at which the data are stored in the data registers 51 and 52 under control of the scrambler control circuit 10. In more detail, when a data storing signal is at "H" level, data are held in the data areas R1, R2, R3 and R4 of the data registers 51 and 52. On the other hand, when a data storing signal is at "T" level, data of the 4-bit data on the read/write data lines RWD are stored in the data areas R1, R2, R3 and R4 of the data registers 51 and 52 in accordance with the selection of the scrambler circuits 61 and 62.

The data output 1 can be obtained from an address determined in response to the clock CLK "1" as follows: The column address select lines C1 to Cn/2 including the determined head address and the column address select lines C1 to Cn/2 adjacent thereto in the output sequence direction are selectively activated under control of the scrambler control circuit 10. Consequently, the corresponding column gates 11, 12, 13, . . . , in are selected, so that 4-bit data are outputted to the data lines DLN. These data are sensed by the data buffer 4 to determine the read/write data line RWD, as shown in FIG. 2(C). Data which constitute the first two bits of the 4-bit output 1 are stored in the data areas R1 and R2 through the scrambler circuit 61, at the timing as shown in FIG. 2(D). Thereafter, in response to the clock "3" two cycles after the cycle at which the head address has been determined, even if an address is not determined from the outside, the scrambler control circuit 10 activates the column select lines in the same way as with the case where the third address of the output 1 has been determined from the outside. FIG. 2(F) shows the status in which the data are read to the data lines DLN and further determined by the read/write data lines RWD. The third and fourth bits of the 4-bit output 1 determined as described above are stored in the data areas R3 and R4 of the data register 52 through the scrambler circuit 62, as shown in FIG. 2(E). The similar operation is repeated in sequence for each two cycles of the clock CLK.

On the other hand, the data stored in the data registers 51 and 52 are accessed in the sequence of the data areas R1, R2, R3 and R4 as shown over the clock CLK in FIG. 2(A). After having been transferred to the read/write data lines RWD, the data are stored in the data registers 51 and 52 in accordance with the address sequence expected by the scrambler control circuit 10. Therefore, it is possible to output the data in the expected sequence. On the other hand, when the head address of a series of the data is determined again, the data can be outputted as the output 2 or the output 3, as shown in FIGS. 2(H) and (I), respectively. In more detail, when data are required to be outputted continuously beginning from a new address in response to the clock CLK "12", a new head address is determined from the outside in response to the clock CLK 9. Then, new data can be transferred in the same way as described above; the data are determined as shown by A in FIG. 2(C); stored in the data areas R1 and R2; and further outputted continuously following the output 1.

Further, before a series of the data of the output 2 are outputted, a new head address of the output 3 is determined. The data of the output 3 are outputted beginning from the data area R3 of the data register 52. The sequence of the data transfer is the same as with the case of the outputs 1 and 2. The new head address is determined at the row of the clock CLK "11". The 4-bit data including the head address are determined on the read/write data lines RWD, as shown by B in FIG. 2(F). The 2 bits of the 4-bit data are selected by the scrambler circuit 62, and stored in the data areas R3 and R4 of the data register 52 at the timing as shown in FIG. 2(E). In the same way, the 4-bit data are transferred for each two cycles, and further 2 bits of the data are selected. The above-mentioned sequence is repeated to output a series of data continuously.

Further, in the case where a series of 8-bit data are outputted, the scrambler control circuit 10 selects the column select lines C1 to Cn/2 and the scrambler circuits 61 and 62, respectively in sequence as follows: Here, the description will be made on condition that the column select lines C1 to C4 shown in FIG. 1 correspond to the data sequence of a series of 8-bit data.

The mode in which 8-bit data are accessed in series circularly will be first explained. In this case, the number of the head address is eight. Table 1 lists the relationship among the eight serial and cyclic access modes classified according to the eight head address, a pair of select lines C1 to C4 to be selected, 2-bit read/write data lines RWD to be selected from the read/write data lines RWD on which the 4-bit data have been determined, and the data areas R1 to R4 of the data registers 51 and 52, respectively.

TABLE 1

| SER ACCESS SEQ | (a) R1 R2 | R3 R4 | R1 R2 | R3 R4 |
|---|---|---|---|---|
| (1) | (A)(c1,c2) | (c2,c3) | (c3,c4) | (c4,c1) |
| 1–2–3–4–5–6–7–8 | (B) 1  2 | 3  4 | 1  2 | 3  4 |
| (2) | (A)(c1,c2) | (c2,c3) | (c3,c4) | (c4,c1) |
| 2–3–4–5–6–7–8–1 | (B) 2  3 | 4  1 | 2  3 | 4  1 |
| (3) | (A)(c2,c3) | (c3,c4) | (c4,c1) | (c1,c2) |
| 3–4–5–6–7–8–1–2 | (B) 3  4 | 1  2 | 3  4 | 1  2 |
| (4) | (A)(c2,c3) | (c3,c4) | (c4,c1) | (c1,c2) |
| 4–5–6–7–8–1–2–3 | (B) 4  1 | 2  3 | 4  1 | 2  3 |
| (5) | (A)(c3,c4) | (c4,c1) | (c1,c2) | (c2,c3) |
| 5–6–7–8–1–2–3–4 | (B) 1  2 | 3  4 | 1  2 | 3  4 |
| (6) | (A)(c3,c4) | (c4,c1) | (c1,c2) | (c2,c3) |
| 6–7–8–1–2–3–4–5 | (B) 2  3 | 4  1 | 2  3 | 4  1 |
| (7) | (A)(c4,c1) | (c1,c2) | (c2,c3) | (c3,c4) |
| 7–8–1–2–3–4–5–6 | (B) 3  4 | 1  2 | 3  4 | 1  2 |
| (8) | (A)(c4,c1) | (c1,c2) | (c2,c3) | (c3,c4) |
| 8–1–2–3–4–5–6–7 | (B) 4  1 | 2  3 | 4  1 | 2  3 |

(a): DATA AREAS OF DATA REGISTERS
(A): A PAIR OF COLUMN SELECT LINES SELECTED
(B): RWD LINES CONNECTED TO REGISTERS

The mode in which 3 address bits representative of the 8-bit series data are accessed by repeating "0" and "1" in sequence irrespective of the carry bit from the least significant bit will be next explained. In this access sequence, the least significant bit repeats "0" and "1" alternately for each cycle; the second bit repeats "0" and "1" for each two cycles as "00110011"; and the third bit repeats "0" or "1" for each four cycles as "0000111100001111". Table 2 lists the similar relationship among the eight serial and cyclic access modes classified according to the eight head address, a pair of select lines C1 to C4 to be selected, 2-bit read/write data lines RWD to be selected from the read/write data lines RWD on which the 4-bit data have been determined, and the data areas R1 to R4 of the data registers 51 and 52, respectively.

TABLE 2

| SER ACCESS SEQ | (a) R1 R2 | R3 R4 | R1 R2 | R3 R4 |
|---|---|---|---|---|
| (1) | (A)(c1,c2) | (c2,c3) | (c3,c4) | (c4,c1) |
| 1–2–3–4–5–6–7–8 | (B) 1  2 | 3  4 | 1  2 | 3  4 |
| (2) | (A)(c1,c2) | (c2, c3) | (c3, c4) | (c4,c1) |
| 2–1–4–3–6–5–8–7 | (B) 2  3 | 4  3 | 2  1 | 4  3 |
| (3) | (A)(c2,c1) | (c1,c4) | (c4,c3) | (c3,c2) |
| 3–4–1–2–7–8–5–6 | (B) 3  4 | 1  2 | 3  4 | 1  2 |
| (4) | (A)(c2,c1) | (c1,c4) | (c4,c3) | (c3,c2) |
| 4–3–2–1–8–7–6–5 | (B) 4  3 | 2  1 | 4  3 | 2  1 |
| (5) | (A)(c3,c4) | (c4,c1) | (c1,c2) | (c2,c3) |
| 5–6–7–8–1–2–3–4 | (B) 1  2 | 3  4 | 1  2 | 3  4 |
| (6) | (A)(c3,c4) | (c4,c1) | (c1,c2) | (c2,c3) |
| 6–5–8–7–2–1–4–3 | (B) 2  1 | 4  3 | 2  1 | 4  3 |
| (7) | (A)(c4,c3) | (c3,c2) | (c2,c1) | (c1,c4) |
| 7–8–5–6–3–4–1–2 | (B) 3  4 | 1  2 | 3  4 | 1  2 |
| (8) | (A)(c4,c3) | (c3,c2) | (c2,c1) | (c1,c4) |
| 8–7–6–5–4–3–2–1 | (B) 4  3 | 2  1 | 1  3 | 2  1 |

(a): DATA AREAS OF DATA REGISTERS
(A): A PAIR OF COLUMN SELECT LINES SELECTED
(B): RWD LINES CONNECTED TO REGISTERS

In Tables 1 and 2, the selection (A) of the column select lines C1 to Cn/2 and the connection (B) of the selected read/write data lines RWD to the data areas R1, R2, R3 and R4 of the data registers 51 and 52 are both shown in the same column from the functional standpoint. However, the operational timings are different from each other. Further, the data selected and transferred through the column select lines C1 to Cn/2 are added thereafter to the data areas R1, R2, R3 and R4, as depicted by the timing chart shown in FIG. 2.

Further, in the above-mentioned embodiment, the number of columns b11 to b(n/2)2 connected to the data lines DLN simultaneously by the column select lines C1 to Cn/2 is two. In the actual system, however, this number changes according to the time required to determined the data beginning from the columns b11 to b(n/2)2 to the read/write data lines RWD.

Figure 3:
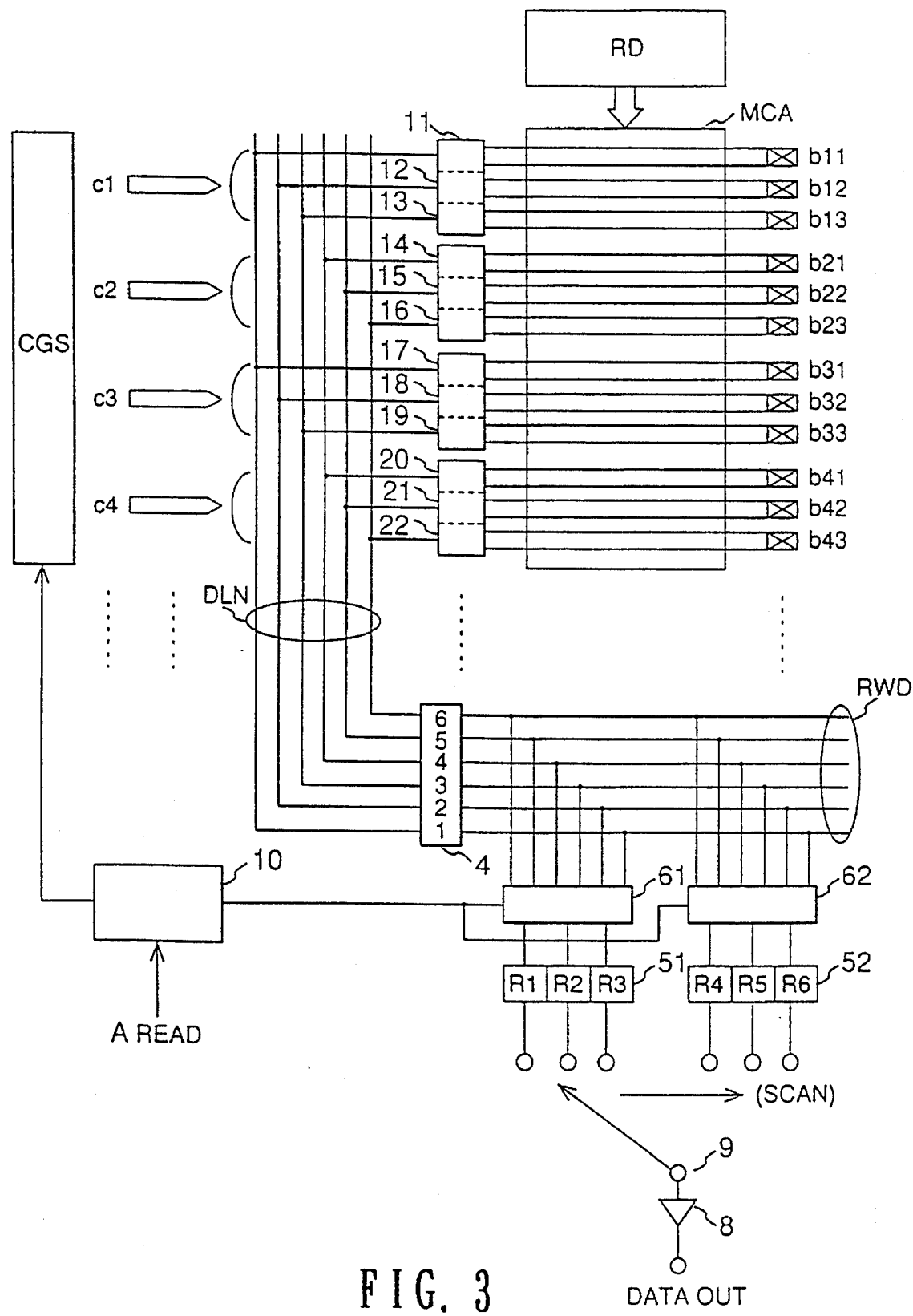
FIG. 3 is a block diagram showing another embodiment of the semiconductor memory device according to the present invention.
Figure 4:
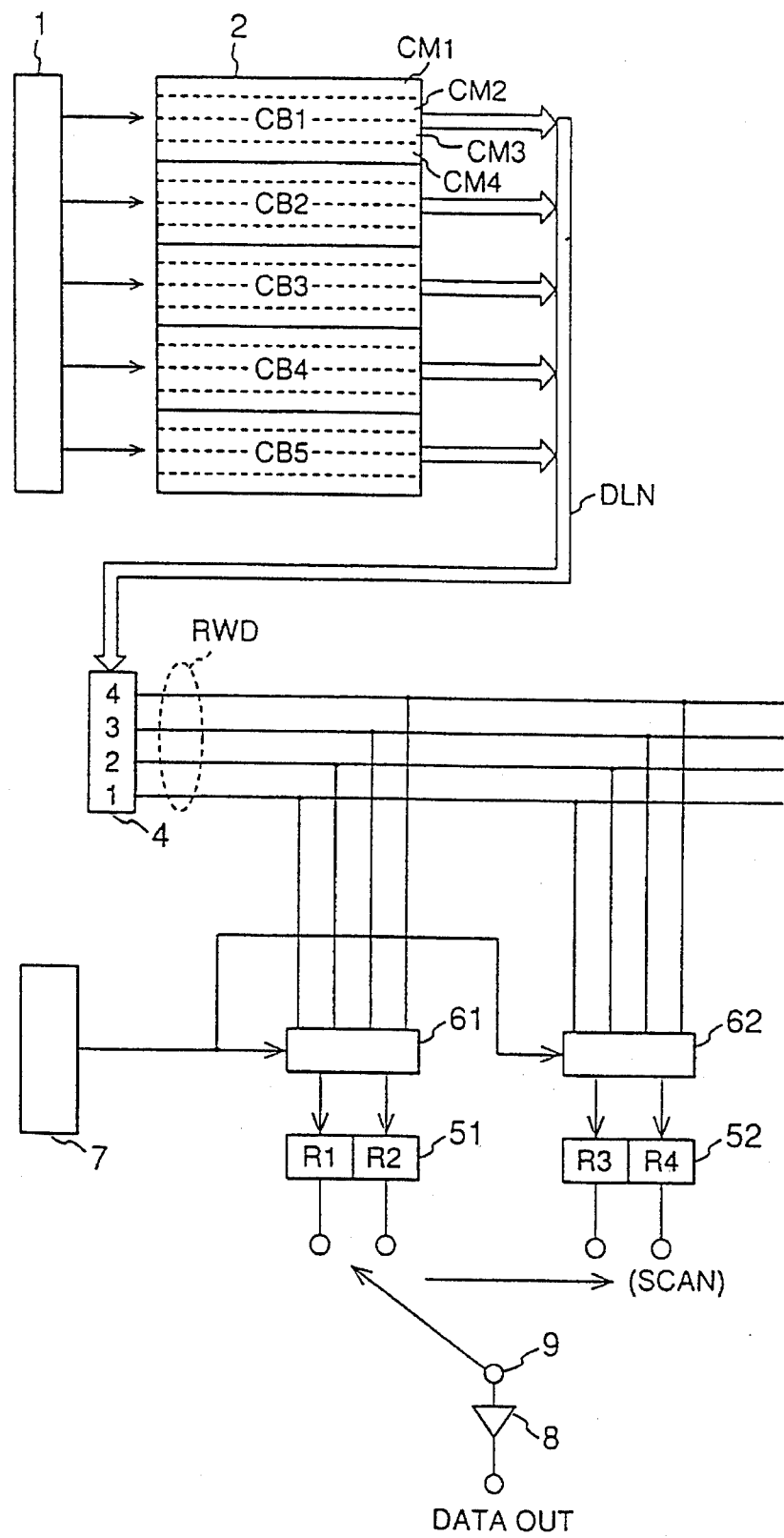
FIG. 4 is a block diagram showing a semiconductor memory device disclosed in a prior application by the same inventors.

FIG. 3 shows another embodiment of the semiconductor memory device according to the present invention, which is configured on the basis of the above-mentioned standpoint. In FIG. 3, two sets of the data stored in the columns b11, b23, b13, b21, b22, b23, . . . are selected simultaneously 3 bits by 3 bits through the column select lines C1, C2, . . . by the column gates 11, 12, 13, . . . . Therefore, the number of the data lines DLN and that of the read/write data lines RWD are six, respectively. Further, the number of bits of the data register 51 becomes 3 bits in correspondence to the data areas R1, R2 and R3, and similarly the number of bits of the data register 52 becomes 3 bits in correspondence to the data areas R4, R5 and R6.

As described above, in the configuration as shown in FIG. 3, two sets of the columns b11, b12 and b13; the columns b31, b32 and b33; the columns b41, 42 and 43 are selected simultaneously by the column gates 11, 12 and 13, and then outputted to the data lines DLN as 6-bit data. The outputted 6-bit data are transferred to the read/write data lines RWD through the data buffer 4, and further transferred to and stored in the data registers 51 and 52 3 bits by 3 bits through the scrambler circuits 61 and 62, respectively. The stored data can be outputted to the outside through the data buffer 8 by selecting the data areas R1, R2, R3, R4, R5 and R6 of the data registers 51 and 52 through the data selection section 9. In this embodiment, the addresses are updated for each 3 cycles.

In general, when the data are transferred from the columns to just before the registers within a (a indicates an integer) cycles, the number of the columns selected by one column select line is a. Therefore, when two column select lines are selected simultaneously, 2 a-bit data can be transferred. Here, although the number of output registers is 2a, the data are selectively stored in the a-unit registers by selecting a-bit data from the 2a-bit data. As described above, it is possible to access a series of data more than the number of the output registers by selecting the two column select lines for each a cycles.

In the above description, FIG. 1 shows the case where the number of registers of a single register group 51 or 52 is two, and FIG. 3 shows the case where the number of the registers thereof is extended to three. However, it is necessary to store data in any of the register groups 51 and 52 simultaneously as a series of continuous data in which data received from any arbitrary column is arranged as a head data. To satisfy the requirement, a plurality of the column select lines are selected simultaneously, as already described, and a string of data which always contain a series of data are transferred. After that, a series of the data are selected from the string of data, scrambled, and then stored in one of the register groups 51 and 52, respectively, as shown in FIGS. 1 and 2. However, there exist other methods. That is, in the case of the example as shown in FIG. 3, data twice the number of registers constituting the register group are selected and then transferred. However, it is unnecessary to determine the number of data to be transfer twice as large as the number of registers.

Figure 5:
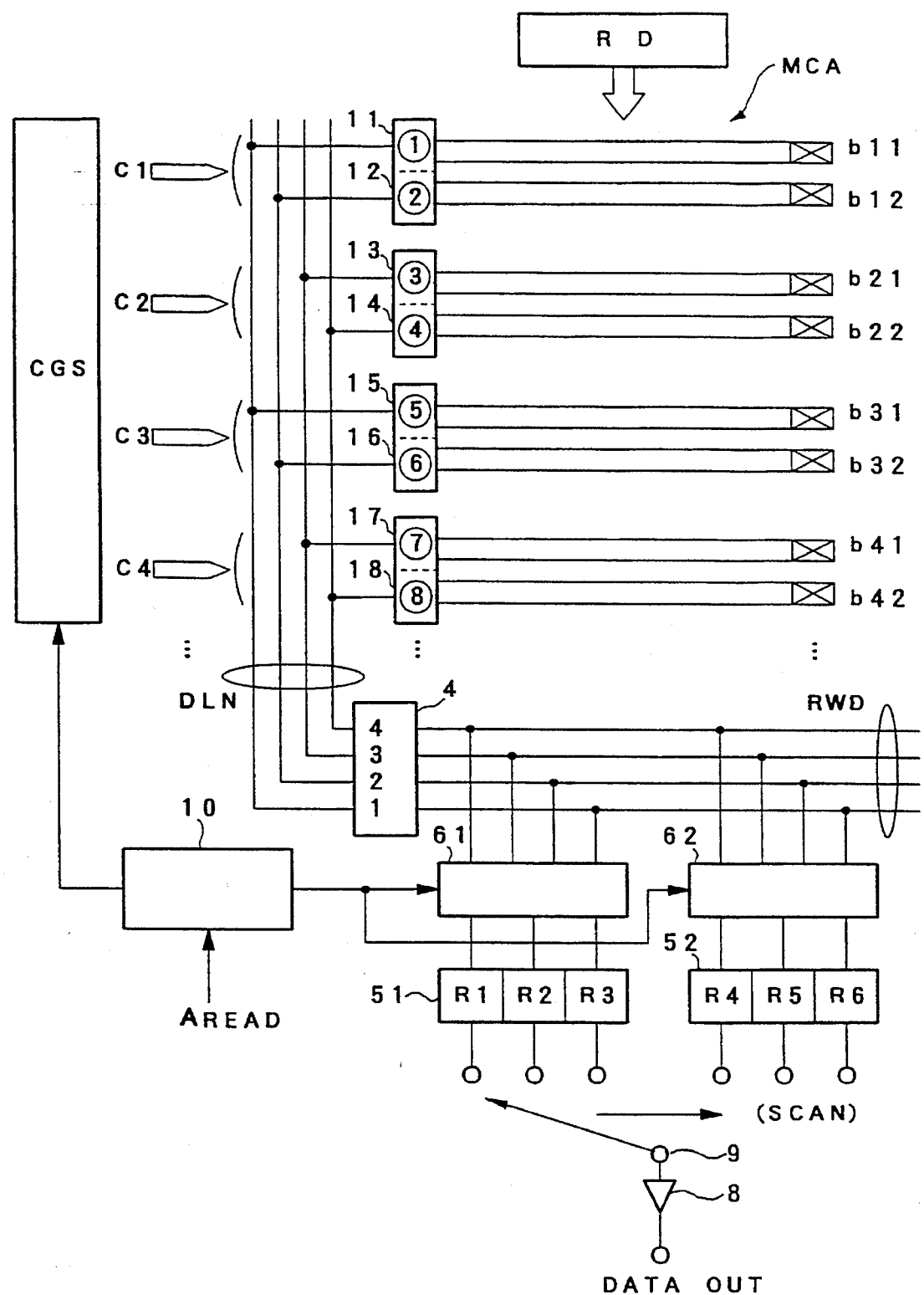
FIGS. 5 and 6 are block diagrams showing other embodiments of the present invention.

FIG. 5 shows another embodiment in which each register group is composed of three registers as in FIG. 3. However, the number of columns selected by one column select line is different between the embodiments shown in FIGS. 3 and 5. That is, the number of columns selected by the single column select line is three in the embodiment shown in FIG. 3 but two in the embodiment shown in FIG. 5.

In the case of FIG. 5, when the column select line corresponding to the head column and the column select line corresponding to the succeeding column are selected, data can be stored in each register group simultaneously in such a way that data of any arbitrary column can be arranged as the head data, as well understood with reference to Table 3 below. Table 3 lists the case where 6-bit serial access is made and the data access range is twice (i.e., eight) the number (i.e. four) of data transferred simultaneously.

TABLE 3

| SERIAL ACCESS COLUMN SEQUENCE (FIG. 1) | (a) R1 R2 R3 | R4 R5 R6 |
|---|---|---|
| (1) | (A) (c1, c2) | (c2, c3) |
| 1–2–3–4–5–6 | (B) 1  2  3 | 4  1  2 |
| (2) | (A) (c1, c2) | (c3, c4) |
| 2–3–4–5–6–7 | (B) 2  3  4 | 1  2  3 |
| (3) | (A) (c2, c3) | (c3, c4) |
| 3–4–5–6–7–8 | (B) 3  4  1 | 2  3  4 |
| (4) | (A) (c2, c3) | (c1, c4) |
| 4–5–6–7–8–1 | (B) 4  1  2 | 3  4  1 |
| (5) | (A) (c3, c4) | (c1, c4) |
| 5–6–7–8–1–2 | (B) 1  2  3 | 4  1  2 |
| (6) | (A) (c3, c4) | (c1, c2) |
| 6–7–8–1–2–3- | (B) 2  3  4 | 1  2  3 |

(a): Data storing registers
(A): Selected column select lines
(B): scramble-selected data lines Table 3 indicates that it is possible to realize the data transfer as shown in FIG. 1 by use of only three registers, without arranging six data lines (twice the number (three) of the registers of each register group).

Figure 6:
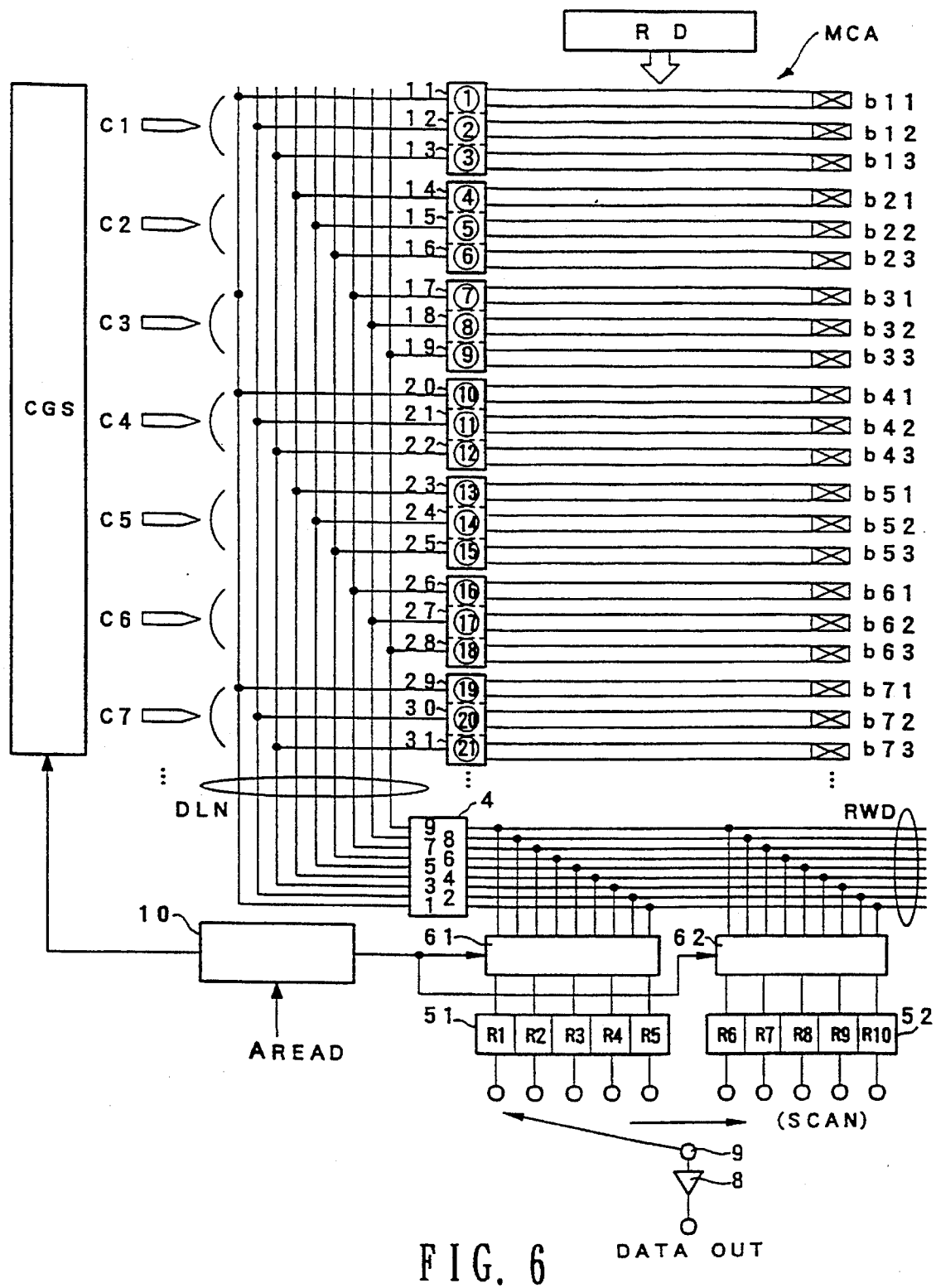

FIG. 6 shows another embodiment in which a single column line selects three columns simultaneously and further each register group is composed of five registers. In this embodiment, when the three column select lines are selected simultaneously at its maximum, it is possible to store a series of column data in each register group in such a way that data of any arbitrary column can be arranged as the head data.

Table 4 shows this embodiment in the same way as in Table 3. In Table 4, the serial access data length is ten and the data access range is twice (i.e., 18) the number of data transferred simultaneously.

data) can be stored in one register group as shown in FIGS. 5 and 6 will be described hereinbelow.

Figure 7:
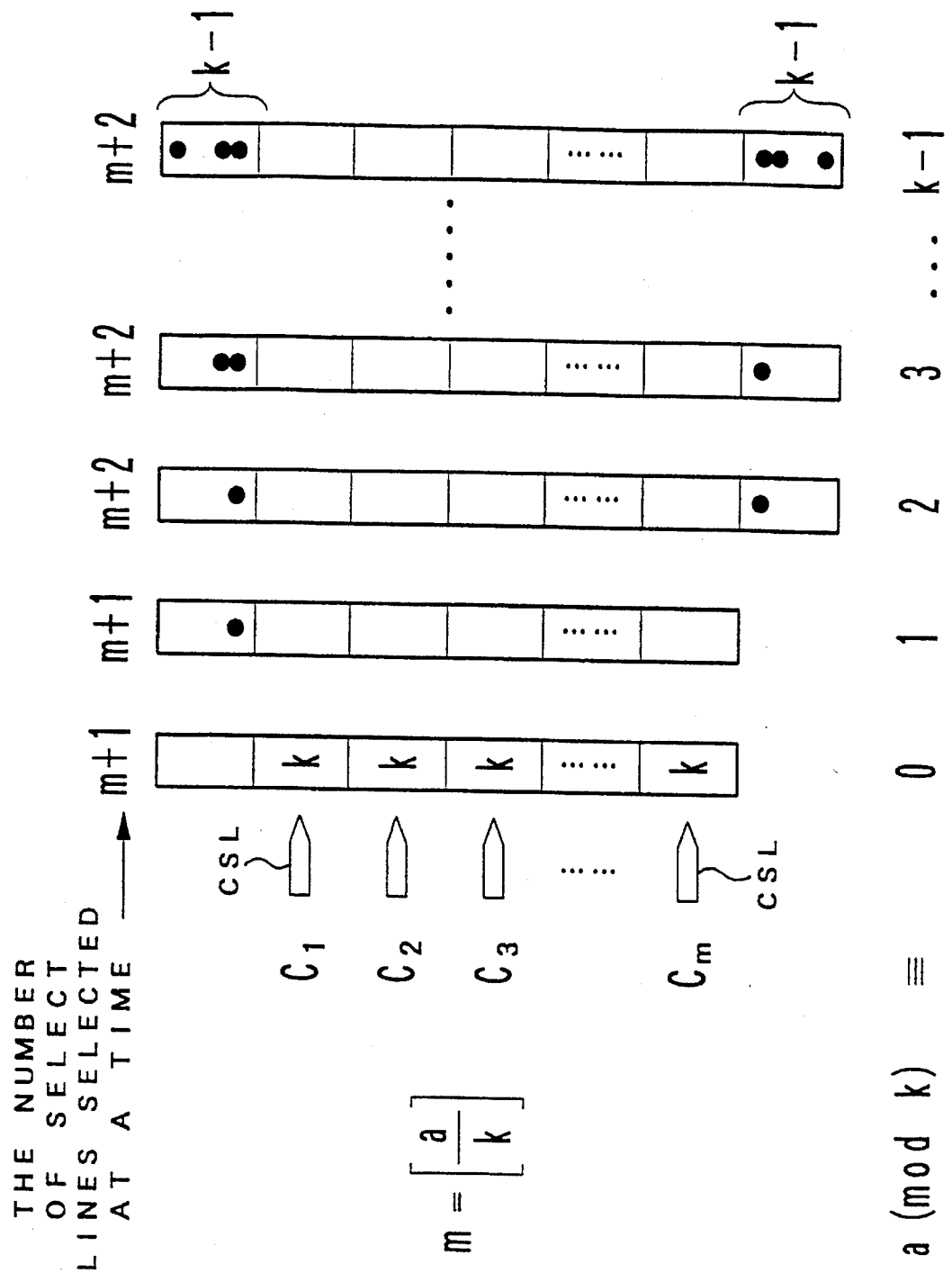
FIG. 7 is an illustration for assistance in explaining the present invention in more generic form.

As shown in FIG. 7, the assumption is made that k-units of columns are selected by a single column select line CSL and k-units of data are accessed. Further, each register group is composed of a-units of registers, and a-units of data are assumed to be stored simultaneously.

TABLE 4

| SERIAL ACCESS COLUMN SEQUENCE (FIG. 2) | (a) R1 R2 R3 R4 R5 | R6 R7 R8 R9 R10 |
|---|---|---|
| (1) | (A) (c1,c2) | (c2,c3,c4) |
| 1-2-3-4-5-6-7-8-9-10 | (B) 1 2 3 4 5 | 6 7 8 9 1 |
| (2) | (A) (c1,c2) | (c3,c4) |
| 2-3-4-5-6-7-8-9-10-11 | (B) 2 3 4 5 6 | 7 8 9 1 2 |
| (3) | (A) (c1,c2,c3) | (c3,c4) |
| 3-4-5-6-7-8-9-10-11-12 | (B) 3 4 5 6 7 | 8 9 1 2 3 |
| (4) | (A) (c2,c3) | (c3,c4,c5) |
| 4-5-6-7-8-9-10-11-12-13 | (B) 4 5 6 7 8 | 9 1 2 3 4 |
| (5) | (A) (c2,c3) | (c4,c5) |
| 5-6-7-8-9-10-11-12-13-14 | (B) 5 6 7 8 9 | 1 2 3 4 5 |
| (6) | (A) (c2,c3,c4) | (c4,c5) |
| 6-7-8-9-10-11-12-13-14-15 | (B) 6 7 8 9 1 | 2 3 4 5 6 |
| (7) | (A) (c3,c4) | (c4,c5,c6) |
| 7-8-9-10-11-12-13-14-15-16 | (B) 7 8 9 1 2 | 3 4 5 6 7 |
| (8) | (A) (c3,c4) | (c5,c6) |
| 8-9-10-11-12-13-14-15-16-17 | (B) 8 9 1 2 3 | 4 5 6 7 8 |
| (9) | (A) (c3,c4,c5) | (c5,c6) |
| 9-10-11-12-13-14-15-16-17-18 | (B) 9 1 2 3 4 | 5 6 7 8 9 |
| (10) | (A) (c4,c5) | (c1,c5,c6) |
| 10-11-12-13-14-15-16-17-18-1 | (B) 1 2 3 4 5 | 6 7 8 9 1 |
| (11) | (A) (c4,c5) | (c1,c6) |
| 11-12-13-14-15-16-17-18-1-2 | (B) 2 3 4 5 6 | 7 8 9 1 2 |
| (12) | (A) (c4,c5,c6) | (c1,c6) |
| 12-13-14-15-16-17-18-1-2-3 | (B) 3 4 5 6 7 | 8 9 1 2 3 |
| (13) | (A) (c5,c6) | (c1,c2,c6) |
| 13-14-15-16-17-18-1-2-3-4 | (B) 4 5 6 7 8 | 9 1 2 3 4 |
| (14) | (A) (c5,c6) | (c1,c2) |
| 14-15-16-17-18-1-2-3-4-5 | (B) 5 6 7 8 9 | 1 2 3 4 5 |
| (15) | (A) (c1,c5,c6) | (c1,c2) |
| 15-16-17-18-1-2-3-4-5-6 | (B) 6 7 8 9 1 | 2 3 4 5 6 |
| (16) | (A) (c1,c6) | (c1,c2,c3) |
| 16-17-18-1-2-3-4-5-6-7 | (B) 7 8 9 1 2 | 3 4 5 6 7 |
| (17) | (A) (c1,c6) | (c2,c3) |
| 17-18-1-2-3-4-5-6-7-8 | (B) 8 9 1 2 3 | 4 5 6 7 8 |
| (18) | (A) (c1,c2,c6) | (c2,c3) |
| 18-1-2-3-4-5-6-7-8-9 | (B) 9 1 2 3 4 | 5 6 7 8 9 |

In the above-mentioned embodiments, the data transfer has been studied of the case where the serial access range is 6 and 18. This is because the data access range must be determined twice the number of data lines activated simultaneously in order to prevent data from being mixed on the data transfer lines, in the case of Skip and sequential (cyclic) access. In the case other than the skip and sequential read, it is of course unnecessary to consider the data access range as described above. This is because the column address changes monotonously in the serial access and therefore data will not be mixed with each other.

In general, the number of columns selected by a single column select line at the same time is determined on the basis of the manufacturing precision of the integrated circuit. On the other hand, the number of registers of each register group is decided on the basis of a ratio of the time required to transfer data from the column to the register to the cyclic serial access time.

Under the conditions that the above-mentioned two times are given, the method of how to decide the optimum number of the data transfer lines so that a series of data (in which data at any arbitrary address can be arranged as the head The a-bit data are transferred from the columns in a-units of serial cycles. During this time interval, data so far stored in the register group are serial-accessed from the register group.

To transfer data to the a-unit registers simultaneously, it is necessary to select (m=[a/k])-units of column select lines C1 to Cm at the same time, where m denotes an integer portion of a/k. Further, the number of column select lines to be further selected for simultaneous data register differs according to the number of data of the non-selected columns among the data to be stored simultaneously. The number of columns of the non-selected column data coincides with the congruence number x obtained by a modulus of a/k:x≡a [mod k].

In order to select the columns in such a way that a-bit data are obtained continuously by arranging data at any arbitrary column as the head data, it is necessary to further select another number of column select lines in excess of the m-units of the column select lines. This will be explained with reference to FIG. 7.

That is, if x=0 or 1, the a-units of columns can be selected simultaneously by selecting (m+1)-units of the column select lines (inclusive of the head column) at the same time. Further, if x=2 to k-1, the a-units of columns can be selected simultaneously by selecting (m+2)-units of the column select lines at the same time. Therefore, if the number of the maximum column select lines to be selected simultaneously is L, it is necessary to arrange (L×k)-units of data transfer line pairs.

In conclusion, the optimal data transfer system and method can be summarized as follows:

1. The number k of columns selected by a single column select line is decided on the basis of the manufacturing precision.
2. The number a of registers of each register group is decided in such a way that the data transfer time from the columns to the registers becomes a x serial cycle period.
3. The number of maximum column select lines selected simultaneously is decided as if a (mod $k$) ≡ 0 or 1,   $L [a/k] + 1$
   if other than the above,   $L [a/k] + 2$ 4. The number n of the data transfer line pairs from the columns to the registers is decided as $n=L \times k$ 5. A scramble circuit for selecting a-unit data from n-unit data and storing the selected data to the register group simultaneously is provided.

As describe above, according to the semiconductor memory device of the present invention, in the synchronous system such that the data are transferred from the columns of the memory cell array to the output registers during a basic data transfer time of a cycles of the basic clock, the operation is as follows: data are transferred from the columns of $a$ bits simultaneously by selecting one column select line. In transferring data for each $a$ cycles, $2a$ bit data are transferred by selecting two column select lines. As described above, $a$-bit data are stored selectively in the $a$-unit output registers of the $2a$-unit output registers. Accordingly, since $a$-bit data exist always in the 2a-bit data transferred from any given address, it is possible to store data in the $a$-unit registers in a predetermined data access sequence for each $a$ cycles. In other words, a new head address can be set for each a cycles and further a series of data can be accessed continuously, irrespective of the number of the data transfer lines and the data registers, thus enabling an optimum synchronous data access.

As described above, in the semiconductor memory device according to the present invention, column data more than the number of the data registers arranged on the output side can be accessed continuously, irrespective of the number of the data registers, and further any access start address can be determined.

What is claimed is:

1. A data transfer system, comprising:
    a plurality of data input/output gates arranged by k-unit group by k-unit group in a predetermined sequence;
    gate selector circuit each arranged for k-unit group of said gates, for selecting said gates in unit of k-unit group;
    a plurality of data transfer paths for transferring data via said gates selected by said gate selector circuit;
    a first register group composed of a-units of data registers for transferring data simultaneously to and from said data transfer paths, the a-unit data registers being serial-accessed in a constant sequence; and
    a scrambler circuit for designating any required data input/output gates and for further selectively connecting said data transfer paths connected to said designated data input/output gates with said data registers so that said data transfer paths connected to said designated input/output gates can be connected to the serial-accessible registers in a predetermined sequence, when the number of the data transfer paths is (L×k) under the following conditions:

if a (mod $k$) ≡ 0, 1,      $L = [a/k] + 1$
    if other than the above,    $L = [a/k] + 2$ where L denotes a maximum number of said gate selecting means selectable simultaneously.

2. The data transfer system of claim 1, which further comprises a second register group having a-units of registers and operable in the same way as said first register group, said first and second register groups being used alternately.

3. The data transfer system of claim 2, wherein said scrambler circuit is composed of a first scramble circuit unit connected between a data buffer and said first register group and a second scramble circuit unit connected between said data buffer and said second register group.

4. The data transfer system of claim 2, wherein k=2; L=3 and a=3.

5. The data transfer system of claim 2, wherein k=3; L=4 and a=5.

6. The data transfer system of claim 1, wherein said a-unit data registers are scanned on the basis of a clock signal.

7. The data transfer system of claim 6, wherein k=2; L=3 and a=3.

8. The data transfer system of claim 6, therein k=3; L=4 and a=5.

9. The data transfer system of claim 1, wherein said gate selector circuit selects (L×k)-units of said data input/output gates simultaneously.

10. The data transfer system of claim 9, which further comprises a second register group having a plurality of registers and operable in the same way as said first register group, said first and second register groups being used alternately.

11. The data transfer system of claim 10, wherein said scrambler circuit is composed of a first scramble circuit unit connected between said data buffer and said first register group and a second scramble circuit unit connected between said data buffer and said second register group.

12. The data transfer system of claim 9, wherein said gate selector circuit select said k-th k-unit data input/output gates and said at least (k+1)-th k-unit data input/output gates simultaneously.

13. The data transfer system of claim 12, which further comprises a second register having a plurality of registers and operable in the same way as said first register group, said first and second register groups being used alternately.

14. The data transfer system of claims 13, wherein said scrambler circuit is composed of a first scramble circuit unit connected between said data buffer and said first register group and a second scramble circuit unit connected between said data buffer and said second register group.

15. The data transfer system of claim 2, wherein k=2; L=3 and a=3.

16. The data transfer system of claim 9, wherein k=3; L=4 and a=5.

17. The data transfer system of claim 1, wherein k=2; L=3 and a=3.

18. The data transfer system of claim 1, wherein k=3; L=4 and a=5.

19. A semiconductor memory device, comprising:

a memory cell array (MCA) composed of a plurality of memory cells arranged into a matrix pattern and having n-pairs of bit lines, a plurality of the memory cells arranged in a column direction being connected to each of the bit line pairs;

a row decode circuit (RD) for decoding a row address inputted thereto to select the memory cells arranged in a row direction;

(2k)-units of data lines (DLN), number (2k) of said data lines being smaller than n, each of the bit line pairs being connected to any of said data lines and thereby a plurality of the bit line pairs being connected in common to each of said data lines;

n-units of column gates (11, 12, . . .) each connected between each of said data lines and each of the bit line pairs and turned on or off to connect or disconnect each of said data lines to and from each of the bit line pairs;

n/k-units of column select lines (C1, C2, C3, C4, . . .) each connected to control terminals of mutually-adjacent k-units of said column gates, for turning on or off said k-unit column gates simultaneously; the first to fourth column select lines (C1 to C4) turning on said first and second column gates, said third and fourth column gates, said fifth and sixth column gates, and said seventh and eighth column gates, respectively to select the corresponding first and second, third and fourth, fifth and sixth, and seventh and eighth bit line pairs, respectively;

a column gate select circuit (CGS) for activating said column select lines;

a data buffer (4) connected to the said data lines, for buffering and outputting data read to said data lines;

register means (51, 52) having 2k-units of registers each for storing one-bit data outputted by said buffer;

a transfer circuit (61, 62) connected between said data buffer and said register means, for scrambling 2k-units of data outputted by said data buffer and storing the scrambled data in the registers of said register means in a predetermined sequence;

a scanning circuit (9) for scanning the registers in the predetermined sequence to output data stored in the registers;

an output buffer circuit (8) for buffering and outputting data given by said scanning circuit to the outside; and in cyclic and continuous selection of the bit line pairs, i) when the bit line pair to be selected first is selected by said column select line C1, said column gate select circuit selects said column select lines in sequence of (C1, C2), (C2, C3), (C3, C4), (C4, C1);

ii) when the bit line pair to be selected first is selected by said column select line C2, said column gate select circuit selects said column select lines in sequence of (C2, C1), (C1, C4), (C4, C3) (C3, C2);

iii) when the bit line pair to be selected first is selected by said column select line C3, said column gate select circuit selects said column select lines in sequence of (C3, C4), (C4, C1),(C1, C2), (C2, C3); and iv) when the bit line pair to be selected first is selected by said column select line C4, said column gate select circuit selects said column select lines in sequence of (C4, C3) (C3, C2), (C2, C1), (C1, C4).

20. The semiconductor memory device of claim 19, wherein said register means is composed of t-units of register groups each composed of the k-unit registers, the respective register groups being interleaved in use.

21. The semiconductor memory device of claim 20, wherein said transfer circuit is composed of t-units of transfer circuit units each connected between said data buffer and each of the register groups.

22. The semiconductor memory device of claim 19, wherein said scanning circuit is activated on the basis of a clock signal.

23. The semiconductor memory device of claim 19, wherein k=2.

24. The semiconductor memory device of claim 19, wherein k=3.

* * * * *